(12) United States Patent
Hol et al.

(10) Patent No.: US 7,088,428 B2
(45) Date of Patent: Aug. 8, 2006

(54) LITHOGRAPHIC ACTUATOR MECHANISM, LITHOGRAPHIC APPARATUS, AND DEVICE MANUFACTURING METHOD

(75) Inventors: Sven Antoin Johan Hol, Eindhoven (NL); Edwin Johan Buis, Belfeld (NL); Harmen Klaas Van Der Schoot, Vught (NL); Patricia Vreugdewater, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 23 days.

(21) Appl. No.: 10/797,618

(22) Filed: Mar. 11, 2004

(65) Prior Publication Data
US 2004/0218167 A1   Nov. 4, 2004

(51) Int. Cl.
 G03B 27/42    (2006.01)
 G03B 27/62    (2006.01)
 G03B 27/58    (2006.01)
(52) U.S. Cl. .............................. 355/72; 355/75; 355/53
(58) Field of Classification Search .................. 355/72, 355/75, 53, 77; 310/12, 58, 60; 335/302; 336/200
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,081,179 A | 6/2000 | Kato | |
| 6,084,319 A * | 7/2000 | Kamata et al. | 310/12 |
| 6,476,383 B1 | 11/2002 | Esslinger et al. | |
| 6,606,019 B1 * | 8/2003 | Ohashi | 335/302 |
| 2002/0096946 A1 | 7/2002 | Bisschops | |
| 2003/0048167 A1 * | 3/2003 | Inoue et al. | 336/200 |
| 2003/0141769 A1 * | 7/2003 | Kubo | 310/12 |

FOREIGN PATENT DOCUMENTS

| | | |
|---|---|---|
| WO | WO 98/33096 | 7/1998 |
| WO | WO 98/38597 | 9/1998 |
| WO | WO 98/40791 | 9/1998 |

OTHER PUBLICATIONS

European Search Report in reference to EP 03 25 1446, dated Feb. 5, 2004.

\* cited by examiner

*Primary Examiner*—Peter B. Kim
(74) *Attorney, Agent, or Firm*—Pillsbury Winthrop Shaw Pittman, LLP

(57) ABSTRACT

Lorentz actuators generate heat due to electrical dissipation in the field coils. As the field through the coils changes, eddy currents are induced in cooling elements leading to undesirable damping forces and heating. The present invention provides an improved design that reduces eddy currents by incorporating slits in the cooling element. Slits are preferably perpendicular to the induced electric field and parallel to each other, and reduce the magnitude of the eddy currents by forcing them to take paths of higher electrical resistance.

21 Claims, 4 Drawing Sheets ers the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support may be embodied as a frame or table, for example, which may be fixed or movable as required; and

LITHOGRAPHIC ACTUATOR MECHANISM, LITHOGRAPHIC APPARATUS, AND DEVICE MANUFACTURING METHOD

BACKGROUND OF THE INVENTION

Priority Information

This application claims priority from European Patent Application No. 03251446.5, filed Mar. 11, 2003, herein incorporated by reference in its entirety.

1. Field of the Invention

The present invention relates to a lithographic apparatus, and in particular, to a lithographic actuator mechanism and an associated device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired;

a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronics. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support may be embodied as a frame or table, for example, which may be fixed or movable as required; and a programmable LCD array: an example of such a construction is given in U.S. Pat. No. 5,229,872, which is incorporated herein by reference. As above, the support in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth here above.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,26,796, both incorporated herein by reference.

A lithographic apparatus of the type described above employ a plurality of actuators for positioning a part or component of the apparatus. Such actuators are applied for positioning a substrate table, a part of an irradiation system, a part of an illumination system or any other part of the lithographic apparatus.

A commonly used actuator is the Lorentz actuator. In such a device, an actuating force is derived from the magnetic field associated with a current driven through a suitably arranged coil. Short stroke Lorentz actuators are used to provide a drive between the substrate or mask stage and the mirror block, on which the substrate or mask is mounted. Large current densities are required in order to provide sufficiently powerful and compact actuators, which leads to significant dissipative heating within the coils.

SUMMARY OF THE INVENTION

As noted above, because of the heat dissipation, cooling elements are sometimes incorporated that consist of thermally conductive plates are provided on the top and bottom of the coils, with water flowing in built-in water channels acting to remove the heat. Also, metals are sometimes used because materials that are good thermal conductors (i.e. metals) are also good electrical conductors. However, during operation, the efficiency of the Lorentz actuator is limited by eddy currents induced in the body of the cooling plates by time-varying external magnetic fields. Damping forces arising from the generation of eddy currents degrades the dynamical performance of the actuator and the associated dissipative heating degrades the thermal performance. Materials with lower electrical conductivity but acceptable thermal conductivity, such as ceramics, suffer less from eddy current heating than metals but machining of the cooling channels in these materials tends to introduce micro-cracks and imperfections that reduce machine reliability by increasing the risk of coolant leakage and mechanical failure. In EUV systems, the heat sensitivity of critical components is such as to place severe constraints on the amount of heat that can be allowed to radiate from the coils to the mirror block. In these types of systems, the conventional configurations of cooling plates are not sufficient to adequately control the temperature of the coils.

For these and other reasons, the principles of the present invention, as embodied and broadly described herein, provide for a lithographic Lorentz actuator having reduced eddy currents in the cooling element. In one embodiment, a lithographic projection apparatus is presented, comprising a radiation system for providing a beam of radiation, a support for supporting a patterning device that configures the beam according to a desired pattern, a substrate holder for holding a substrate, projection system for projecting the patterned beam onto a target portion of the substrate, and an actuator mechanism a coil arrangement in thermal contact with at least one cooling element, wherein the coil arrangement includes one or more slits in order to increase the electrical resistance of eddy current paths.

The slits in the cooling element thus provided act as barriers for the circulating eddy currents, obliging them to take paths of higher electrical resistance. This has the effect of reducing the size of the eddy currents, thus reducing damping forces and the levels of dissipative heating.

According to one embodiment, the slits are arranged to be parallel to each other. This arrangement encourages a uniform eddy current flow, which helps reduce uneven temperature distributions within the cooling element.

According to another embodiment, the slits are arranged to be perpendicular to the direction of the induced electric field. This arrangement is particularly effective in increasing the resistance of eddy current paths and reducing thereby the level of damping and heating.

According to a still another embodiment, the slits are arranged to be substantially parallel or at a substantially oblique angle to the direction of the induced electric field. This arrangement can be more efficiently integrated with certain device arrangements and remains effective in increasing the resistance of eddy current paths and reducing thereby the level of damping and heating.

According to still other embodiments, it is possible to optimize the integration of cooling channels with the slits of the cooling element. In particular, the lengths of the slits can be limited so as not to extend across the entire length of the cooling element to allow more room for cooling channels to be arranged in an efficient way. As an example, adjacent slits may be arranged to extend from opposite sides of the cooling element. Additionally, it is preferable that the cooling channels are arranged so as to have multiple parallel paths wherever possible. This has the effect of reducing the flow impedance through the cooling channel network, thus allowing larger flow rates to be achieved for the same pressure difference. Furthermore, a more symmetrical network allows for a more even coverage of the cooling element thus improving the uniformity of the cooling power.

According to yet still another embodiment, the slits may be filled so as to protect from outgassing from the coils.

The above embodiments describe improvements to the Lorentz actuator that result in improved damping behavior, reduced hotspot temperatures and overall radiation levels to surrounding heat sensitive components such as the mirror block, and reduced actuator mass and volume since the more effective cooling allows for increased current densities.

According to a further embodiment of the invention, there is provided a device manufacturing method comprising supporting a substrate by a substrate holder, providing a beam of radiation using an illumination system, imparting a desired pattern onto the beam of radiation by a patterning device supported by a support, projecting the patterned beam of radiation onto a target portion of the substrate via a projection system; and positioning at least a part of one of the radiation system, the support, the substrate holder, and the projection system by an actuator mechanism, the actuator mechanism comprising a coil arrangement in thermal contact with at least one cooling element, wherein the cooling element is provided with one or more slits configured to increase electrical resistance of eddy current paths.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Lithographic Apparatus

Figure 1:
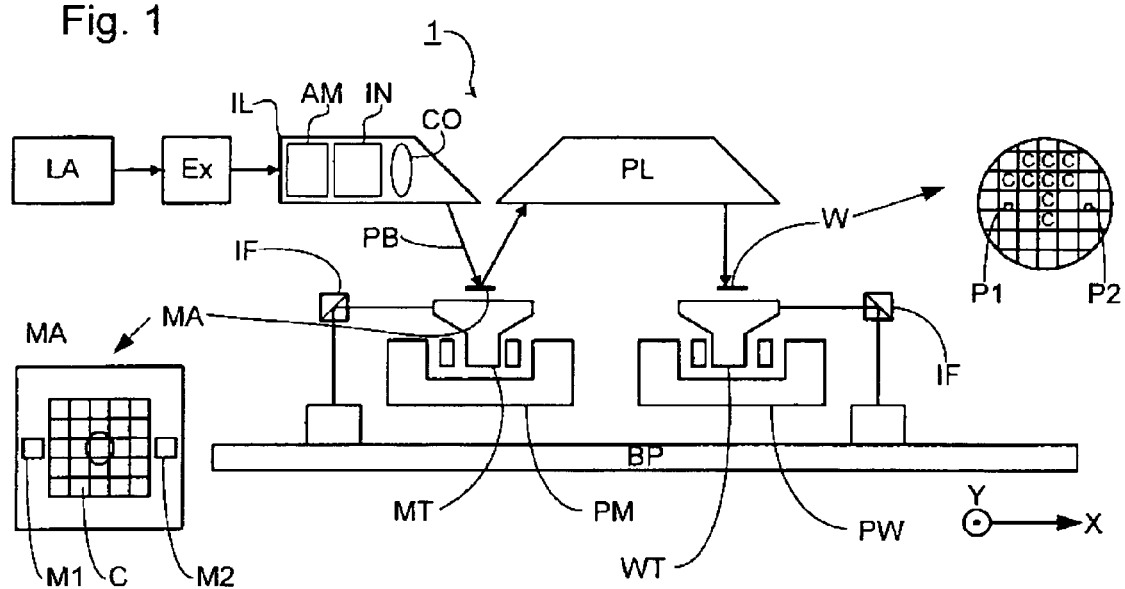
FIG. 1 depicts a lithographic projection apparatus according to an embodiment of the invention.

FIG. 1 schematically depicts a lithographic apparatus according to a particular embodiment of the invention. The apparatus comprises:

a radiation system Ex, IL: for supplying a beam PB of radiation (e.g. UV radiation). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to a projection system ("lens") PL;

a second object table (substrate table) WT: provided with a substrate holder for holding a substrate W (e.g. a resist-coated silicon wafer), and connected to second positioning mechanism PW for accurately positioning the substrate with respect to projection system PL; and the projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a mercury lamp or an excimer laser) produces radiation. This radiation is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism (and interferometric measuring device IF), the substrate table WT can be moved accurately, e.g. so as to position different target portions C in the path of the beam PB. Similarly, the first positioning mechanism can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in a variety of different modes:

step mode: the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure;

scan mode: the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion; and other mode: the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EMBODIMENTS

As noted above, lithographic apparatus employ actuating mechanisms for positioning a part or component of the apparatus. Such actuators are applied for positioning a substrate table, a part of an irradiation system, a part of an illumination system or any other part of the lithographic apparatus.

Figure 2:
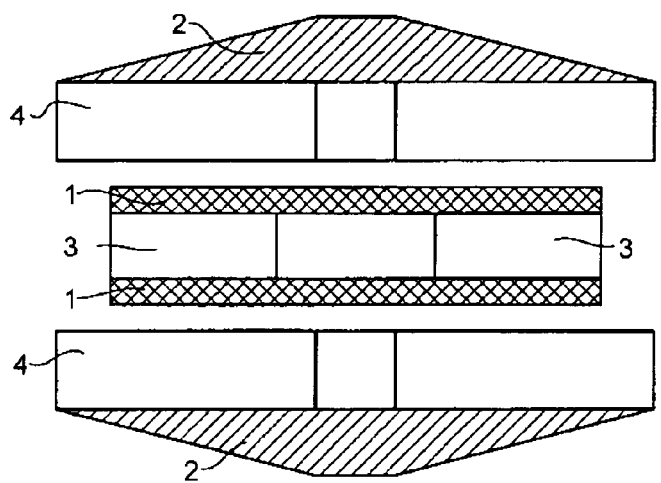
FIG. 2 depicts a side view of the magnetic assembly for a Lorentz actuator showing the coil with attached cooling elements.

Generally, a Lorentz actuator comprises a magnet assembly and an electrically conductive element, such as a coil arrangement. FIG. 2 depicts a side view of the magnetic assembly for a Lorentz actuator. In a typical application, the coil unit, which consists of a coil 3 and cooling elements 1 is connected to the long stroke of the substrate or mask stage (WT or MT), while the magnets 4 with back irons 2 are connected to the short stroke of the mirror block, on which the substrate W or mask MA is mounted.

Figure 3:
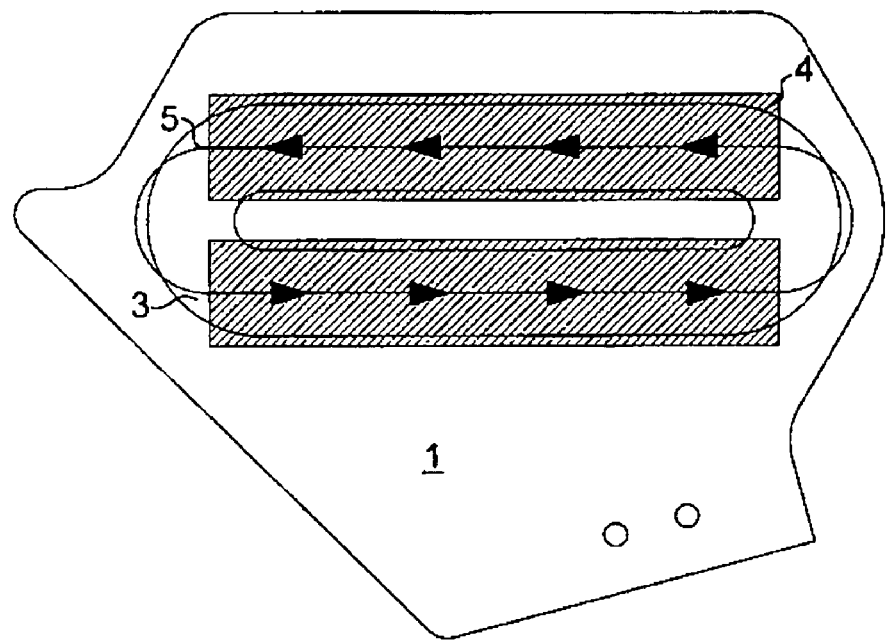
FIG. 3 depicts a top view of a Lorentz actuator with cooling elements showing eddy current flow.

In operation, changing magnetic fields linked by the conductive material of the cooling elements 1 cause eddy currents 5 to flow in the cooling elements 1. The sense of these eddy currents 5 is shown in FIG. 3, for an increasing field directed into the page. The creation of eddy currents 5 provides a drag or damping force that opposes the actuator and reduces its performance. In addition, heat dissipated by the circulating currents reduces the effectiveness of the cooling element 1. This latter effect can be particularly damaging in EUV systems where a number of components are highly sensitive to thermal expansion, which can be induced by radiation from warmer elements nearby.

Figure 4:
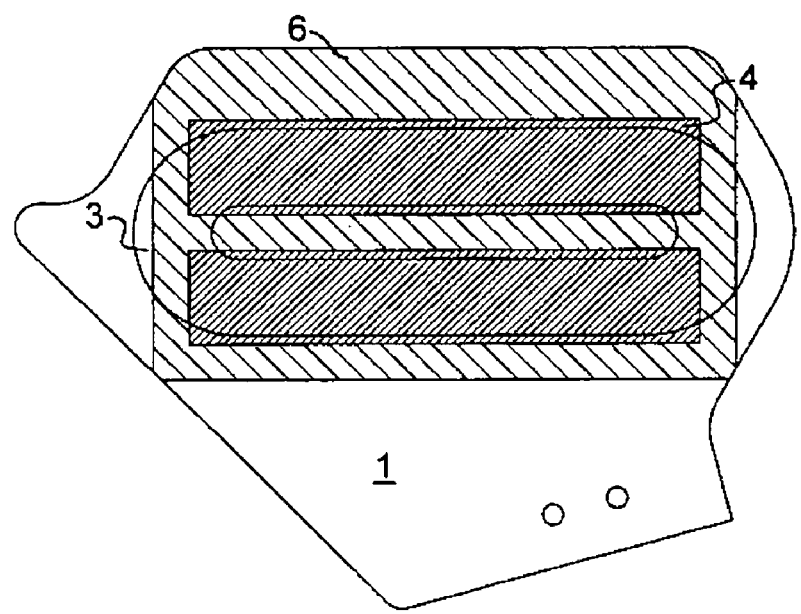
FIG. 4 depicts a top view of a Lorentz actuator with cooling element showing portion susceptible to eddy currents.
Figure 5:
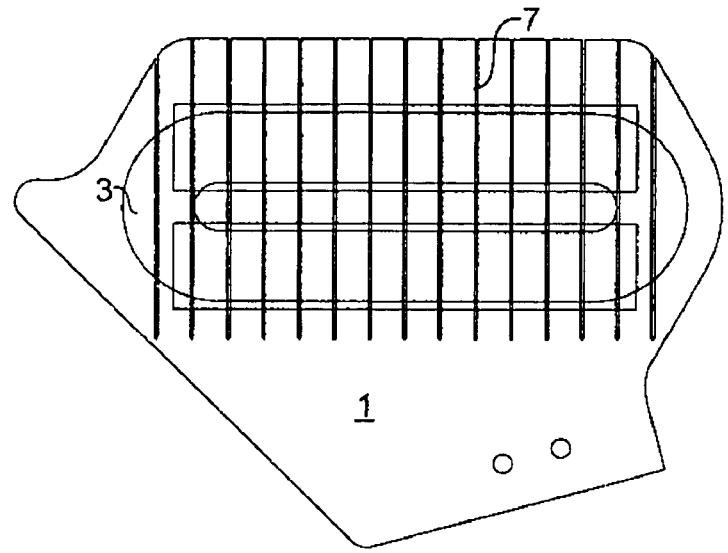
FIG. 5 depicts a top view of a Lorentz actuator with a slitted cooling element according to a preferred embodiment of the present invention.

The area 6 of the cooling plates 1 that is particularly prone to eddy currents, and in which it is most effective to locate structures and/or devices to control eddy currents 5, is indicated in FIG. 4. FIG. 5 illustrates how eddy currents 5 may be controlled according to the present invention by introducing slits 7 in the cooling element 1. Since the resistance across the slits 7 is extremely high, currents are forced to circulate around longer paths of smaller average cross-sectional area. Eddy currents 5 are therefore reduced due to the increased resistance of the eddy current paths. The dissipated heat varies as the square of the current and is therefore also reduced, as is the damping force.

The arrangement in FIG. 5 corresponds to a further preferred embodiment of the invention wherein the slits 7 are parallel to each other. This arrangement is beneficial because it favors a more uniform eddy current flow, so that induced temperature increases are spread out and reduced in magnitude. The slits are also arranged to be largely perpendicular to the eddy current flow depicted in FIG. 3. This arrangement is desirable because it is particularly effective in increasing the resistance of eddy current paths. Alternatively, it may be more desirable to arrange the slits to be parallel or at an oblique angle to the induced field in order to more efficiently coordinate with surrounding device components and to reduce manufacturing costs. These alternative arrangements can also achieve satisfactory increases in the resistance of eddy current paths.

Figure 6:
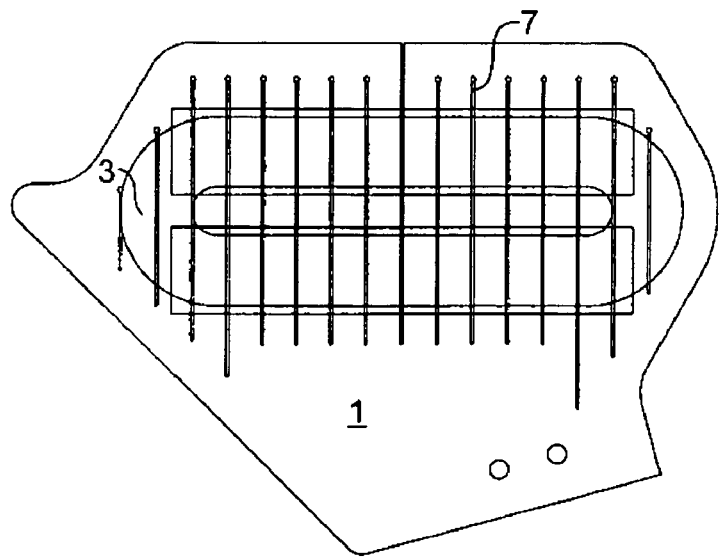
FIG. 6 depicts a top view of a Lorentz actuator with a slitted cooling element according to a further preferred embodiment of the present invention.
Figure 7:
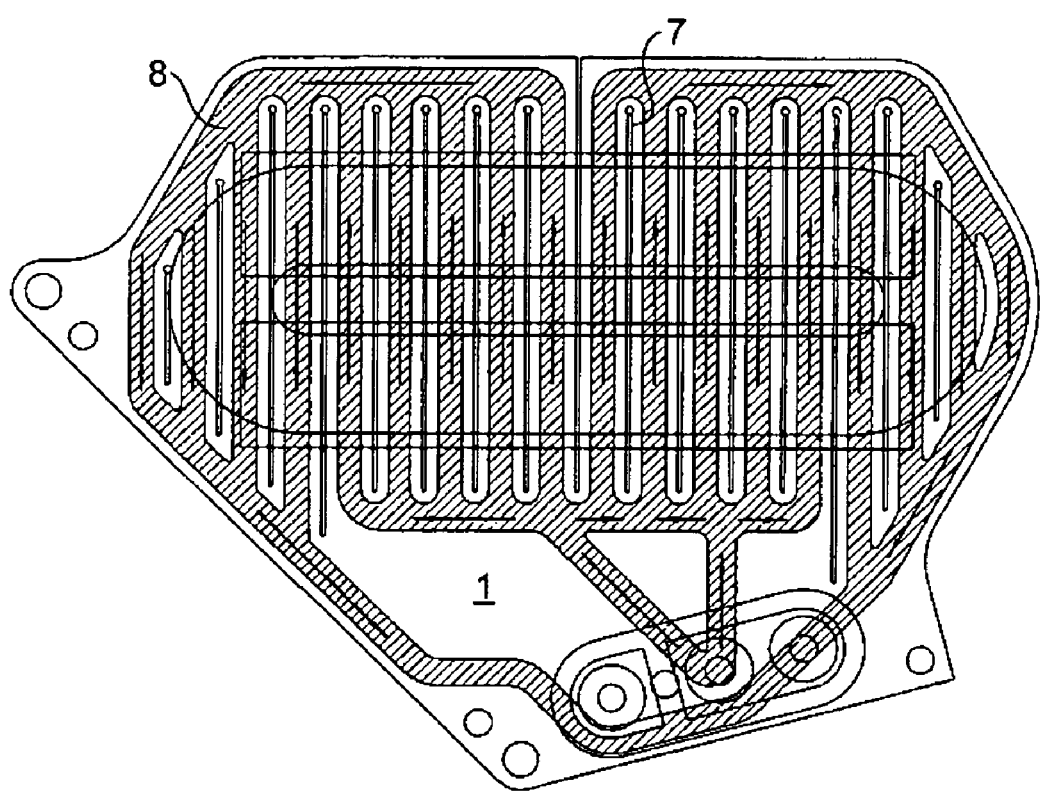
FIG. 7 depicts a top view of a Lorentz actuator with a slitted cooling element according to a still further preferred embodiment of the present invention showing the complimentary arrangement of cooling channels with the slits.

FIGS. 6 and 7 depict an arrangement of slits 7 according to a further preferred embodiment of the present invention. Here, the slits 7 are reduced in length in order to accommodate cooling channels in a more efficient manner. Although it is not essential for the slits 7 to cut completely through the cooling element 3, it is preferable that the slits penetrate through a major part of the cross-section. For cooling channels 8 of reasonable cross-sectional area, therefore, it is necessary that they avoid the slits 7.

Additionally, for optimal cooling and reliability, it is necessary to achieve a rapid and maximally uniform flow of coolant through the cooling element 1. An example arrangement for achieving this is depicted in FIG. 7. For a given pressure gradient driving the flow of coolant, the flow rate depends on the flow impedance of the cooling channel network. The flow impedance of the network depicted in FIG. 7 is kept low by using short sections of cooling channel 8 connected together in parallel. According to the implementation in question, the cooling channels 8 may have a substantially circular or a substantially rectangular cross-section.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   a radiation system configured to provide a beam of radiation;
   a support configured to support a patterning device adapted to impart a desired pattern to the beam of radiation;
   a substrate holder configured to hold a substrate;
   a projection system that projects the patterned beam onto a target portion of the substrate; and
   an actuator configured to position at least one part within the radiation system, the support, the substrate holder, or the projection system, the actuator comprising a coil arrangement in thermal contact with a cooling element, said cooling element being provided with one or more slits configured to increase electrical resistance of eddy current paths.

2. A lithographic apparatus according to claim 1, wherein the slits are arranged to be substantially parallel to each other.

3. A lithographic apparatus according to claim 1, wherein the slits are arranged to be substantially perpendicular to the direction of an induced electric field.

4. A lithographic apparatus according to claim 1, wherein the slits are arranged to be substantially parallel to the direction of an induced electric field.

5. A lithographic apparatus according to claim 1, wherein the slits are arranged to be at an oblique angle, to the direction of an induced electric field.

6. A lithographic apparatus according claim 1, wherein the slit lengths are limited so as not to extend across an entire length of the cooling element.

7. A lithographic apparatus according to claim 1, wherein adjacent slits extend from opposite sides of the cooling element.

8. A lithographic apparatus according to claim 1, wherein cooling channels are integrated with the slits to provide a plurality of parallel paths arranged to reduce flow impedance.

9. A lithographic apparatus according to claim 1, wherein cooling channels are arranged in a substantially symmetrical network to provide uniform coverage of the cooling element.

10. A lithographic apparatus according to claim 1, wherein the slits are filled to protect from outgassing from the coil.

11. A device manufacturing method, comprising:
supporting a substrate by a substrate holder;
providing a beam of radiation using an illumination system;
imparting a desired pattern onto the beam of radiation by a patterning device supported by a support;
projecting the patterned beam of radiation onto a target portion of the substrate via a projection system; and
positioning at least a part of one of the radiation system, the support, the substrate holder, and the projection system by an actuator, the actuator comprising a coil arrangement in thermal contact with a cooling element, wherein the cooling element is provided with one or more slits configured to increase electrical resistance of eddy current paths.

12. A lithographic actuating mechanism, comprising:
a magnet assembly;
a cooling element; and
a coil arrangement in thermal contact with said cooling element;
said cooling element being provided with one or more slits configured to increase electrical resistance of eddy current paths.

13. A lithographic actuating mechanism according to claim 12, wherein the slits are arranged to be substantially parallel to each other.

14. A lithographic actuating mechanism according to claim 12, wherein the slits are arranged to be substantially perpendicular to the direction of an induced electric field.

15. A lithographic actuating mechanism according to claim 12, wherein the slits are arranged to be substantially parallel to the direction of an induced electric field.

16. A lithographic actuating mechanism according to claim 12, wherein the slits are arranged to be at an oblique angle, to the direction of an induced electric field.

17. A lithographic actuating mechanism according to claim 12, wherein the slit lengths are limited so as not to extend across an entire length of the cooling element.

18. A lithographic actuating mechanism according to claim 12, wherein adjacent slits extend from opposite sides of the cooling element.

19. A lithographic actuating mechanism according to claim 12, wherein cooling channels are integrated with the slits to provide a plurality of parallel paths arranged to reduce flow impedance.

20. A lithographic actuating mechanism according to claim 12, wherein cooling channels are arranged in a substantially symmetrical network to provide uniform coverage of the cooling element.

21. A lithographic actuating mechanism according to claim 12, wherein the slits are filled to protect from outgassing from the coil.

* * * * *